United States Patent
Lin et al.

(10) Patent No.: US 9,437,540 B2
(45) Date of Patent: Sep. 6, 2016

(54) ADDITIONAL ETCHING TO INCREASE VIA CONTACT AREA

(71) Applicant: Taiwan Semiconductor Manufacturing Company, Ltd., Hsin-Chu (TW)

(72) Inventors: Pei-Yi Lin, Taichung (TW); Chung-Ju Lee, Hsin-Chu (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/484,589

(22) Filed: Sep. 12, 2014

(65) Prior Publication Data

US 2016/0079161 A1    Mar. 17, 2016

(51) Int. Cl.
*H01L 23/522* (2006.01)
*H01L 23/528* (2006.01)
*H01L 21/3213* (2006.01)
*H01L 21/311* (2006.01)
*H01L 21/768* (2006.01)
*H01L 21/321* (2006.01)
*H01L 23/532* (2006.01)

(52) U.S. Cl.
CPC ...... *H01L 23/5226* (2013.01); *H01L 21/31111* (2013.01); *H01L 21/321* (2013.01); *H01L 21/32134* (2013.01); *H01L 21/76802* (2013.01); *H01L 21/76877* (2013.01); *H01L 21/76886* (2013.01); *H01L 23/53238* (2013.01); *H01L 23/53295* (2013.01)

(58) Field of Classification Search
CPC .................. H01L 21/76807; H01L 21/76802; H01L 23/5226; H01L 23/481; H01L 23/53238
USPC ........ 257/530, 774, 758; 438/622, 637, 625, 438/675, 666
See application file for complete search history.

(56) References Cited

U.S. PATENT DOCUMENTS

| | | | | |
|---|---|---|---|---|
| 2004/0229389 A1* | 11/2004 | Joei | .................. | H01L 21/76802 438/14 |
| 2006/0237853 A1* | 10/2006 | Nogami | ............ | H01L 21/76808 257/775 |
| 2010/0078821 A1* | 4/2010 | Kahlert et al. | .... | H01L 21/76814 257/758 |
| 2010/0119700 A1* | 5/2010 | Kim | .................. | H01L 27/14687 427/123 |
| 2010/0301491 A1* | 12/2010 | Yang | ................. | H01L 21/02063 257/773 |

* cited by examiner

*Primary Examiner* — Cuong Q Nguyen
*Assistant Examiner* — Tong-Ho Kim
(74) *Attorney, Agent, or Firm* — Slater Matsil, LLP

(57) ABSTRACT

An integrated circuit structure includes a dielectric layer, and a conductive line in the dielectric layer. The conductive line has a first top surface and a second top surface lower than the first top surface, and a sidewall connecting the first top surface to the second top surface. A via includes a portion overlying the second top surface of the conductive line. The via is electrically coupled to the conductive line through the second top surface and the sidewall of the conductive line.

20 Claims, 17 Drawing Sheets

ADDITIONAL ETCHING TO INCREASE VIA CONTACT AREA

BACKGROUND

In integrated circuit art, a commonly used method for forming interconnect structures that include metal lines and vias is known as "damascene." Generally, this method involves forming an opening in a dielectric layer, which separates the vertically spaced metallization layers. The opening is typically formed using conventional photo lithography and etching techniques. After the formation, the opening is filled with copper or copper alloys. Excess copper on the surface of the dielectric layer is then removed by a Chemical Mechanical Polish (CMP) process. The remaining copper or copper alloy forms metal vias and/or metal lines.

The term damascene includes dual damascene and single damascene. In a dual damascene process, trenches and via openings are formed first. The via openings are substantially aligned to the conductive features such as metal lines in an underlying layer. The trenches and the via openings are then filled with a conductive material to form metal lines and vias, respectively. In a single damascene process, metal lines or vias, but not both, are formed at the same time.

The contact resistance values between vias and the underlying conductive features depend on the contact areas between the vias and the underlying conductive features. It is desirable that the contact resistance values are small so that the RC delay caused by the interconnect structure is low. However, misalignment may occur in the formation of via openings, and hence a via opening may have a portion not aligned with the underlying conductive feature. This results in contact resistance between the resulting via and the underlying conductive feature increasing undesirably.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
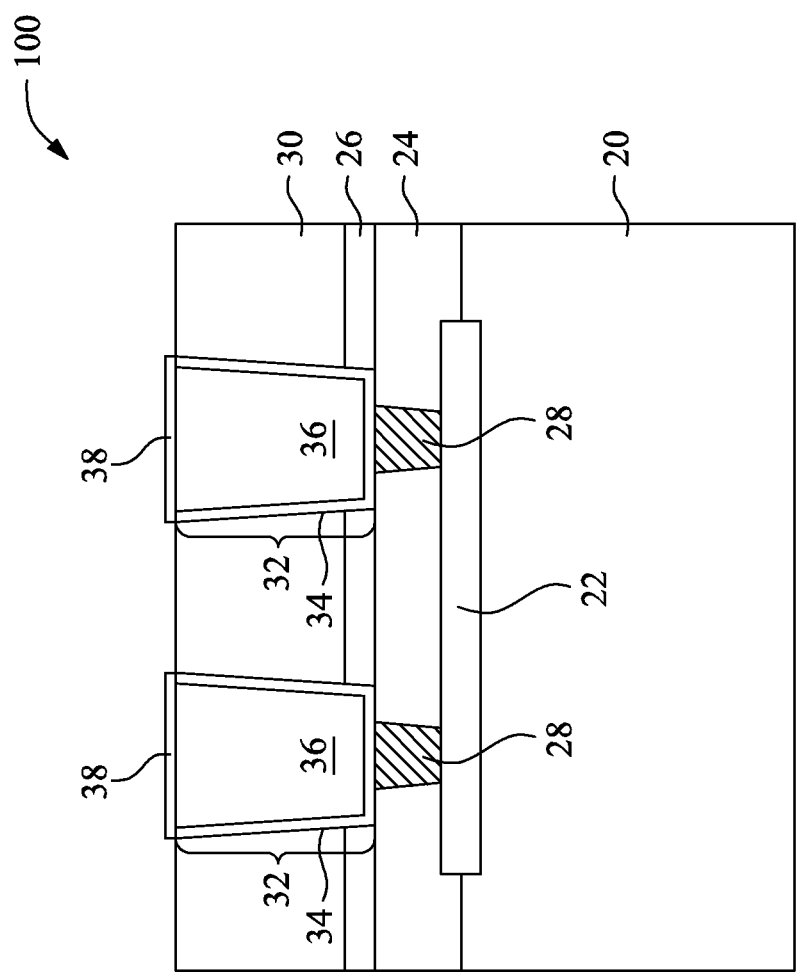
FIGS. 1-7 illustrate the cross-sectional views of intermediate stages in the formation of an interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms such as "underlying," "below," "lower," "overlying," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

Interconnect structures of integrated circuits and the method of forming the same are provided in accordance with various exemplary embodiments. The intermediate stages of forming the interconnect structures are illustrated. The variations of the embodiments are discussed. Throughout the various views and illustrative embodiments, like reference numbers are used to designate like elements.

FIGS. 1 through 15 illustrate the cross-sectional views of intermediate stages in the formation of interconnect structures of integrated circuits in accordance with some embodiments. The steps shown in FIGS. 1 through 15 are also illustrated schematically in the process flow shown in FIG. 17.

FIG. 1 illustrates wafer 100, which includes semiconductor substrate 20 and the features formed on a top surface of semiconductor substrate 20. In accordance with some embodiments, semiconductor substrate 20 comprises crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk silicon substrate or a Silicon-On-Insulator (SOI) substrate.

In accordance with some embodiments of the present disclosure, wafer 100 is used to form a device die. In these embodiments, integrated circuit devices 22 are formed on the top surface of semiconductor substrate 20. Exemplary integrated circuit devices 22 may include Complementary Metal-Oxide Semiconductor (CMOS) transistors, resistors, capacitors, diodes, or the like. The details of integrated circuit devices 22 are not illustrated herein. In alternative embodiments, wafer 100 is used for forming interposers. In these embodiments, no active devices such as transistors and diodes are formed on substrate 20. There may (or may not) be passive devices such as capacitors, resistors, inductors, or the like formed in wafer 100. Substrate 20 may also be a dielectric substrate in the embodiments in which wafer 100 is an interposer wafer. Furthermore, through-vias (not shown) may be formed to penetrate through substrate 20 in order to interconnect the components on the opposite sides of substrate 20.

Inter-Layer Dielectric (ILD) 24 is formed over semiconductor substrate 20 and fills the space between the gate stacks of transistors (not shown) in integrated circuit devices 22. In some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In alternative embodiments of the present disclosure, ILD 24 is formed using a deposition method such as Plasma Enhanced Chemical Vapor Deposition (PECVD), Low Pressure Chemical Vapor Deposition (LPCVD), or the like.

As also shown in FIG. 1, etch stop layer 26 is formed over ILD 24 and integrated circuit devices 22, if any. Etch stop layer 26 may comprise silicon carbide, silicon nitride, silicon oxynitride, silicon carbo-nitride, or the like. Etch stop layer 26 is formed of a material that has a high etching selectivity with the overlying dielectric layer 30 (FIG. 2), and hence etch stop layer 26 may be used to stop the etching of dielectric layer 30.

Contact plugs 28 are formed in ILD 24 and are used to electrically connect to integrated circuit devices 22. For example, contact plugs 28 may include gate contact plugs that are connected to the gate electrodes of transistors (not shown) in integrated circuit devices 22 and source/drain contact plugs that are electrically connected to the source/drain regions of the transistors. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. The formation of contact plugs 28 may include etching ILD 24 to form contact openings, filling a conductive material(s) into the contact openings until the conductive material fills the entireties of the contact openings, and performing a planarization (such as Chemical Mechanical Polish (CMP)) to level the top surfaces of contact plugs 28 with the top surface of ILD 24.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, about 2.5, or even lower. IMD layer 30 may comprise Black Diamond (a registered trademark of Applied Materials), a carbon-containing low-k dielectric material, Hydrogen SilsesQuioxane (HSQ), MethylSilses-Quioxane (MSQ), or the like.

Conductive metal lines 32 are formed in IMD 30. In accordance with some embodiments, metal lines 32 include diffusion barrier layers 34 and copper-containing material 36 over diffusion barrier layers 34. Diffusion barrier layers 34 may include titanium, titanium nitride, tantalum, tantalum nitride, or the like and have the function of preventing copper in copper-containing material 36 from diffusing into IMD 30. Conductive lines 32 are referred to as metal lines 32 hereinafter.

In accordance with some embodiments of the present disclosure, metal caps 38 are formed over metal lines 32. In some embodiments, metal caps 38 include cobalt (Co), CoWP, CoB, tungsten (W), tantalum (Ta), nickel (Ni), molybdenum (Mo), titanium (Ti), iron (Fe), or combinations thereof. Metal caps 38 may be formed selectively using electroless plating, during which wafer 100 is submerged in a plating solution. In alternative embodiments, metal caps 38 are blanket formed on metal lines 32 and IMD 30, followed by an etching process to remove undesirable portions. FIG. 1 illustrates that metal lines 32 are in a bottom metal layer, which is the metal layer immediately over contact plugs 28. The illustrated metal lines 32 also represent metal lines in any metal layer that is over the bottom metal layer.

Figure 2:
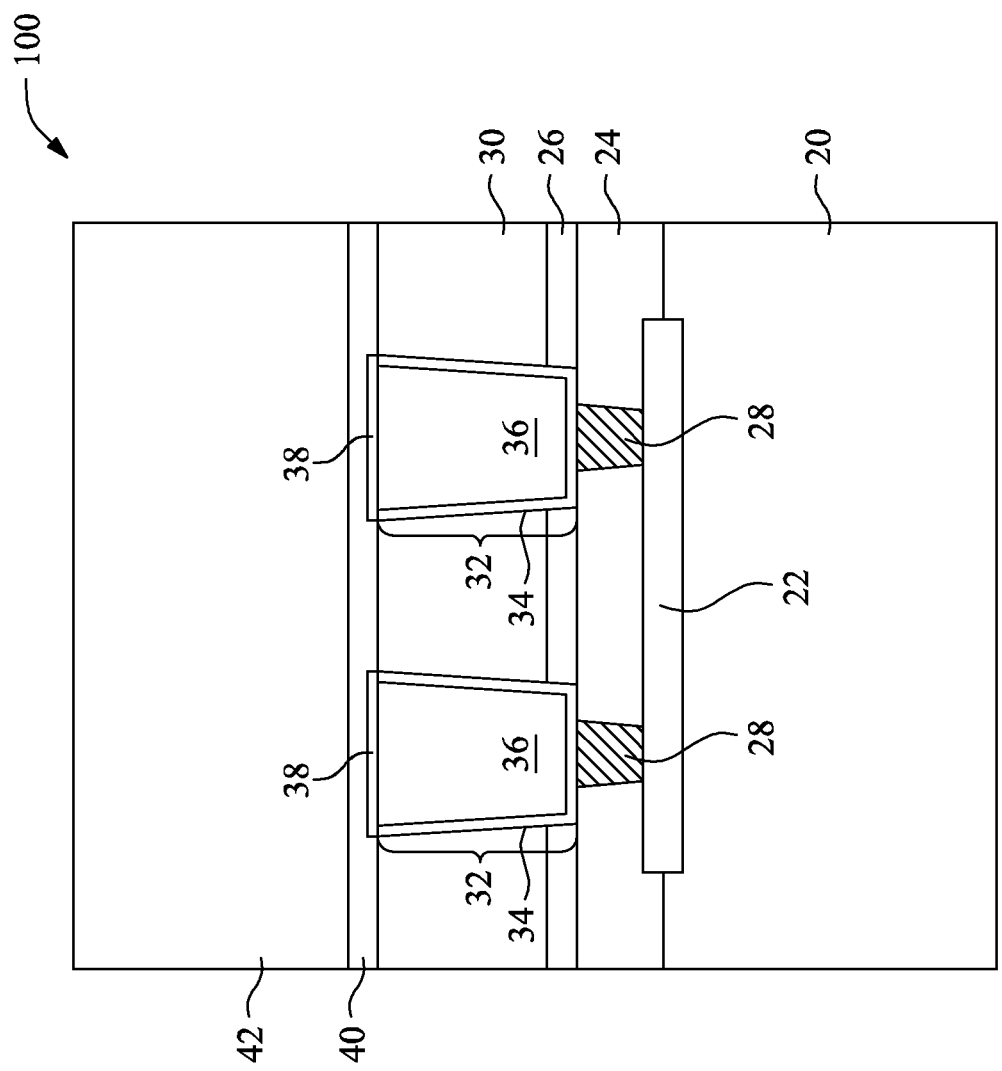

Referring to FIG. 2, etch stop layer 40 and IMD layer 42 are formed. In accordance with some embodiments, etch stop layer 40 is formed of silicon carbide, silicon nitride, silicon oxynitride, silicon carbo-nitride, or the like. Etch stop layer 40 is in contact with metal caps 38 and IMD layer 30. IMD layer 42 may be formed of a material that is selected from the same candidate materials for forming IMD layer 30. For example, IMD layer 42 may be formed of a carbon-containing dielectric material, Black Diamond, HSQ, MSQ, or the like. IMD layer 42 may also have a low-k value, which may be lower than about 3.0, 2.5, or 2.0. In some embodiments of the present disclosure, the formation of IMD layer 42 includes depositing a porogen-containing dielectric material and then performing a curing process to drive out the porogen, and hence the remaining IMD layer 42 is porous.

Figure 3:
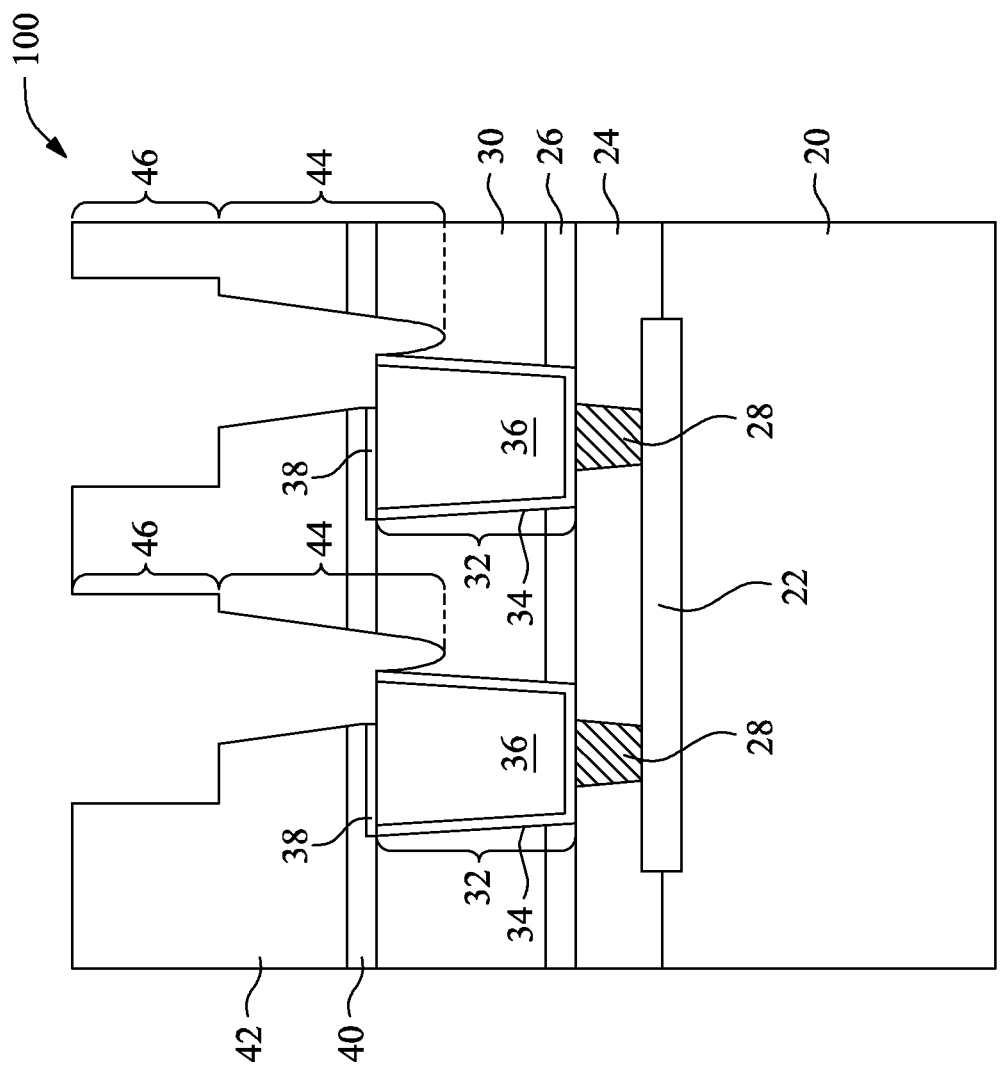

Referring to FIG. 3, trenches 46 and via openings 44 are formed in IMD layer 42. In accordance with some embodiments of the present disclosure, the formation processes includes performing a photo lithography process to etch IMD layer 42 in order to form initial via openings, wherein the initial via openings extend from the top surface of IMD layer 42 to an intermediate level between the top surface and the bottom surface of IMD layer 42. Next, a metal hard mask (not shown) is formed and patterned to define the patterns of trenches 46. An anisotropic etching is then performed to etch IMD layer 42 to form trenches 46. At the same time trenches 46 are formed, the via openings extend down to etch stop layer 40, hence forming via openings 44 as illustrated. The etching step for forming trenches 46 may be performed using a time-mode, and may be stopped after the etching has been performed for a pre-set period of time. Other etch and stop point detection techniques are also contemplated. In alternative embodiments, via openings 44 and trenches 46 are formed in separate photo lithography processes. For example, in a first photo lithography process, via openings 44 are formed to extend all the way down to etch stop layer 40. In a second lithography process, trenches 46 are formed to extend to an intermediate level of IMD 42. Etch stop layer 40 is then etched to expose the underlying metal caps 38.

In accordance with some embodiments of the present disclosure, the etching of IMD layer 42 is performed using a process gas comprising fluorine and carbon, wherein fluorine is used for etching, with carbon protecting the sidewalls of the resulting via openings 44 and trenches 46. With an appropriate fluorine-to-carbon ratio, via openings 44 and trenches 46 may have desirable profiles. For example, the process gases for the etching include a fluorine and carbon containing gas(es) such as $C_4F_8$ and/or $CF_4$ and a carrier gas such as $N_2$. In some exemplary etch processes, the flow rate of $C_4F_8$ is in the range of about 0 sccm to about 50 sccm, the flow rate of $CF_4$ is in the range of about 0 sccm to about 300 sccm, and the flow rate of $N_2$ is in the range of about 0 sccm to about 200 sccm. In alternative embodiments, the process gases for the etching include $CH_2F_2$ and a carrier gas such as $N_2$. In some exemplary etch processes, the flow rate of $CH_2F_2$ is in the range of about 10 sccm to about 200 sccm, and the flow rate of $N_2$ is in the range of about 50 sccm to about 100 sccm. During the etching of IMD layer 42, wafer 100 may be maintained at a temperature between about 30° C. and 60° C. The Radio Frequency (RF) power of the power source used for the etching is lower than about 700 Watts, and the pressure of the process gases is in the range of about 15 mtorr and about 30 mtorr.

After the formation of via openings 44 and trenches 46, metal lines 32 or metal caps 38 (if any left) are exposed to trenches 46. Due to the bombardment effect in the formation of via openings 44, the portions of metal caps 38 may be removed in some embodiments, hence the underlying metal lines 32 may be exposed in some embodiments. In other embodiments, metal caps 38 are exposed.

Overlay misalignment may occur during the formation of via openings 44, and FIG. 3 illustrates a scenario wherein via openings 44 undesirably shifted to the right from the centers of the corresponding underlying metal lines 32. Accordingly, some portions (such as the illustrated right portions of via openings) are misaligned from metal lines 32, causing some portions of IMD layer 30 to be etched, and via openings 44 extend aside of the corresponding metal lines 32. Furthermore, via openings 44 comprise portions lower than the top surfaces of metal lines 32 due to the use of time-mode in the etching process.

It is observed from FIG. 3 that when via openings 44 as illustrated are filled to form vias, the contact area between the vias and metal lines 32 will be smaller than what is intended by design since some portions of the vias no longer land on metal lines 32. Furthermore, some portions of IMD layer 30 may be left on the sidewalls of metal lines 32, preventing the electrical contact of the vias to the sidewalls of metal lines 32. Accordingly, the contact resistance between the vias and metal lines 32 will increase.

Figure 4:
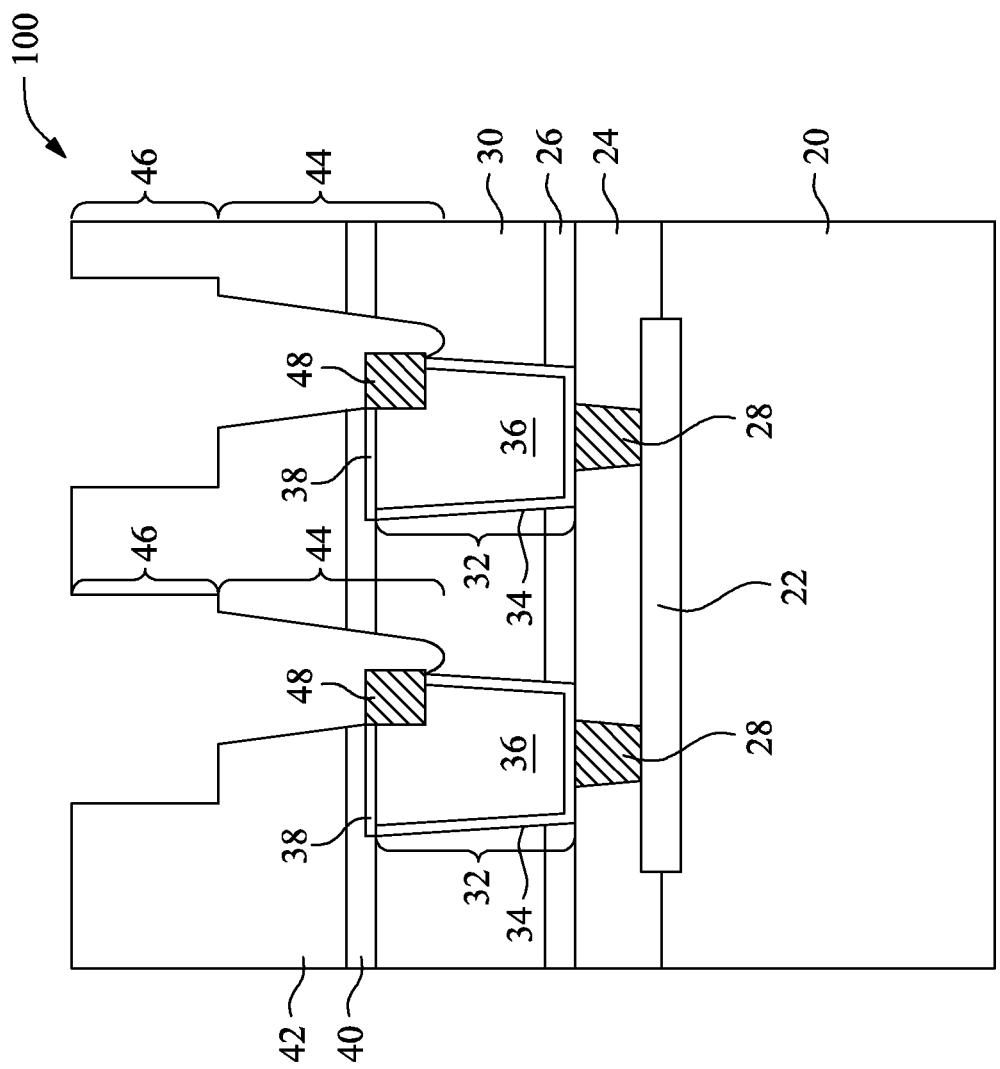
Figure 5:
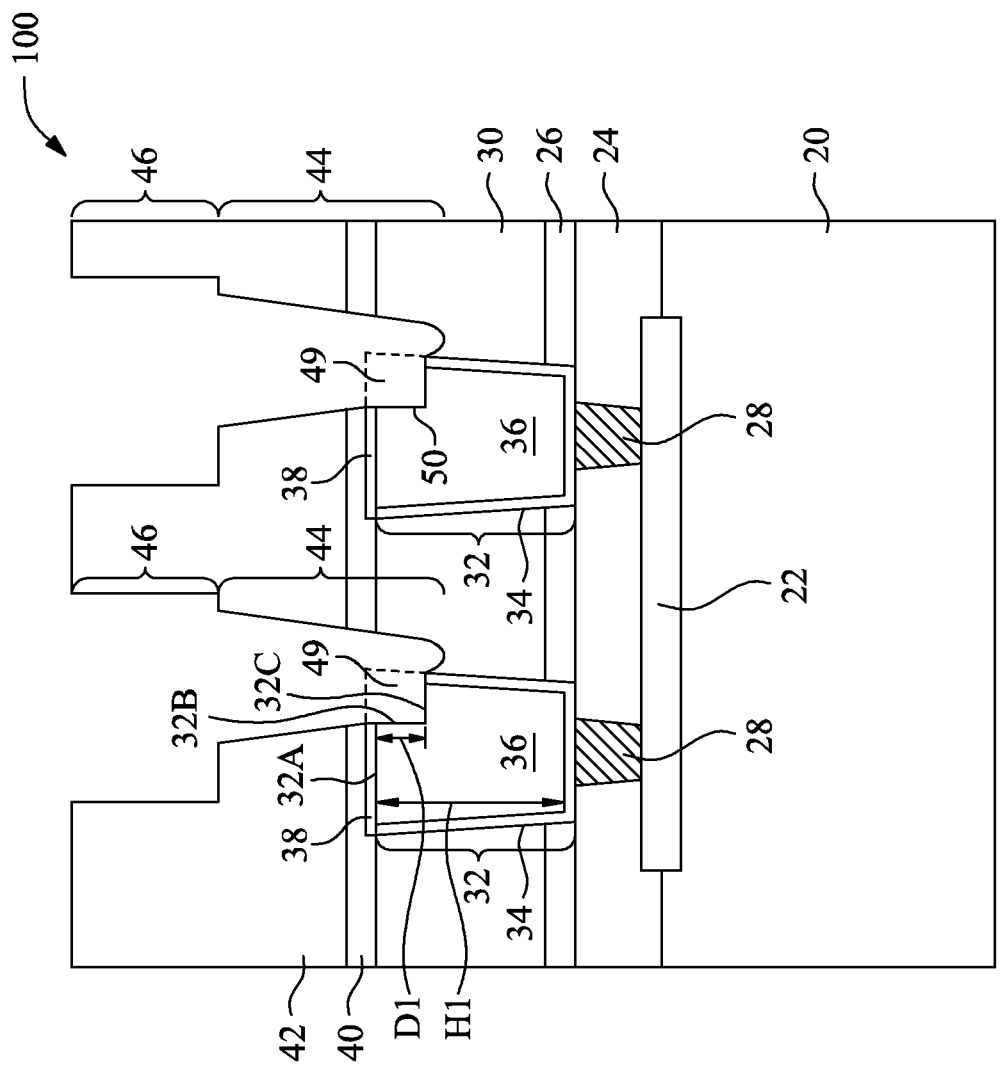

FIGS. 4 and 5 illustrate some exemplary processes for removing corner portions of metal lines. FIG. 4 illustrates the oxidation of the corner portions of metal lines 32. In accordance with some exemplary embodiments, an oxygen ($O_2$) ashing is performed, wherein the process gas may include $O_2$. Furthermore, plasma is turned on to accelerate the oxidation process. As a result, oxide regions 48 are formed out of the corner portions of metal lines 32. Depending on the composition of metal lines 32, oxidation regions 48 may include the oxide of copper-containing material 36, the oxide of diffusion barrier layers 34, and the oxide of metal caps 38. Accordingly, oxide regions 48 may include copper oxide, tungsten oxide, cobalt oxide, titanium oxide, tantalum oxide, and combinations thereof. In accordance with some embodiments, the oxidation process is controlled to be substantially anisotropic so that the portions of metal lines 32 directly underlying the remaining IMD layer 42 are not oxidized.

An etching process is then performed using an etchant that can remove oxide regions 48 but does not etch the un-oxidized portions of metal lines 32, etch stop layer 40, and IMD layers 30 and 42. In some embodiments, the etching is performed using wet etching. The etchant may include a diluted HF solution. In addition, amine may be added to control the etching process. The resulting structure is shown in FIG. 5, wherein recesses 49 are formed at the corners of metal lines 32, and the un-oxidized portions of metal lines 32 are exposed.

In the structure shown in FIG. 5, metal lines 32 include top surfaces 32A, top surfaces 32C lower than top surfaces 32A, and sidewalls 32B connecting top surfaces 32A to the corresponding top surfaces 32C. Top surfaces 32A are planar. Top surfaces 32C may be substantially planar in accordance with some embodiments or may be curved in other embodiments, depending on the oxidation and the etching processes. Sidewalls 32B may also be straight or curved. Top surfaces 32A, sidewalls 32B, and top surfaces 32C may form steps. In accordance with some embodiments, top surfaces 32C are recessed from top surfaces 32A by depth D1, which may be greater than about 1 nm, 2 nm, 5 nm, or greater depending on the height H1 of metal lines 32. Furthermore, the ratio (D1/H1) of depth D1 to height H1 may be greater than about 0.1, 0.2, or 0.3. It is appreciated that a great depth D1 is beneficial for reducing contact resistance.

Figure 6:
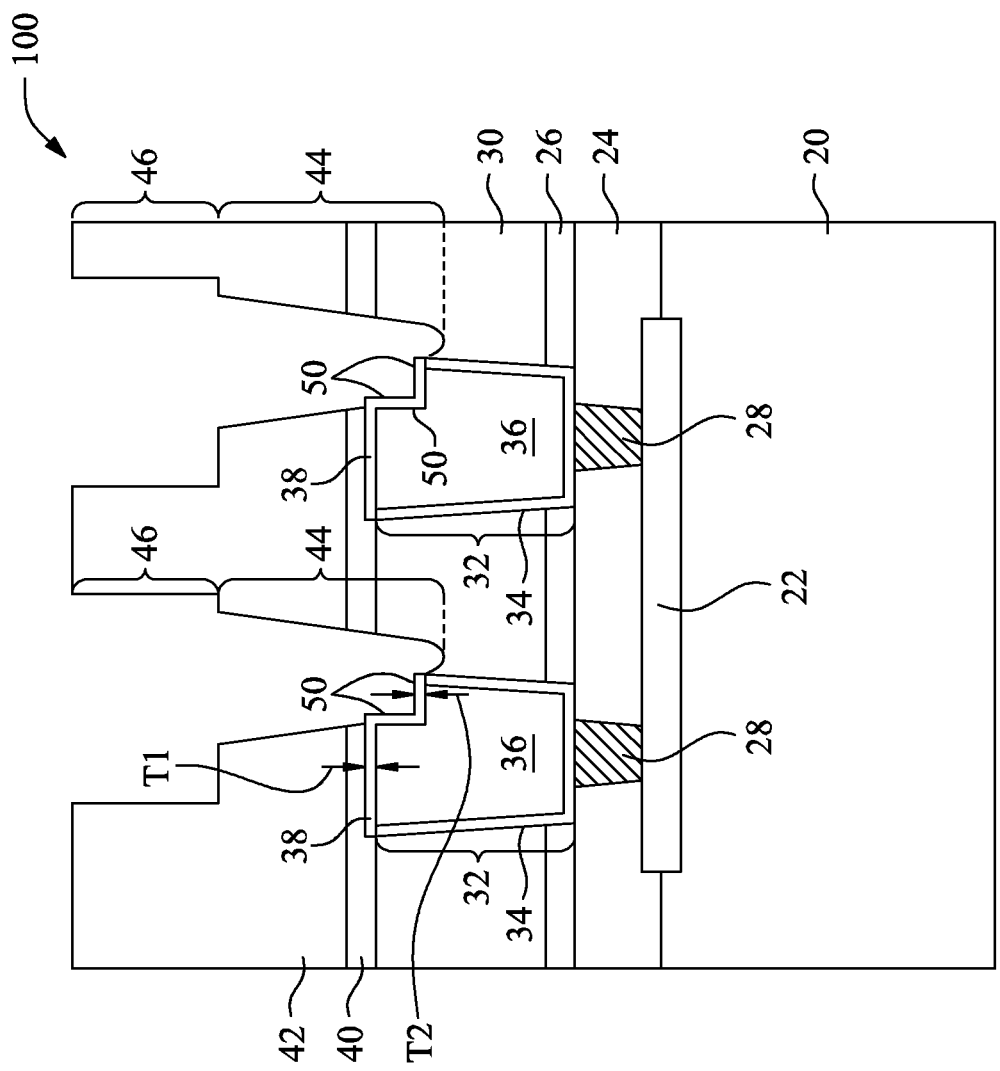

FIG. 6 illustrates the selective formation of metal caps 50 on the exposed surfaces of metal lines 32 including sidewalls 32B and top surfaces 32C and not on the surfaces of dielectric materials such as IMD layers 30 and 42. The exemplary formation process includes plating such as chemical-electro plating or electroless plating. In accordance with some exemplary embodiments, metal caps 50 include Co, CoWP, CoB, W, Ta, Ni, Mo, Ti, Fe, or combinations thereof. Since metal caps 50 and 38 are formed in different process steps, thickness T2 of metal caps 50 may be greater than, equal to, or smaller than thickness T1 of metal caps 38. In addition, the material of metal caps 50 may be the same as or different from the material of metal caps 38. In some embodiments of the present disclosure, one of metal caps 38 and 50 may include an element (such as Co, P, B, W, Ta, Ni, Mo, Ti, or Fe) that is not included in the other one of either. In alternative embodiments, the element(s) in metal caps 38 are the same as in metal caps 50. However, the atomic percentages of the elements in metal caps 38 are different from that in metal caps 50. Throughout the description, metal caps 38 are referred to as having the same composition as metal caps 50 when the elements and the atomic percentages (of the elements) in metal caps 38 are the same as that of metal caps 50. Conversely, if metal caps 38 have different elements and/or different percentages of the elements, then metal caps 38 are referred to as having a different composition than metal caps 50. Accordingly, metal caps 38 and 50 may have the same composition or different compositions. Metal caps 38 and 50 also form steps.

Figure 7:
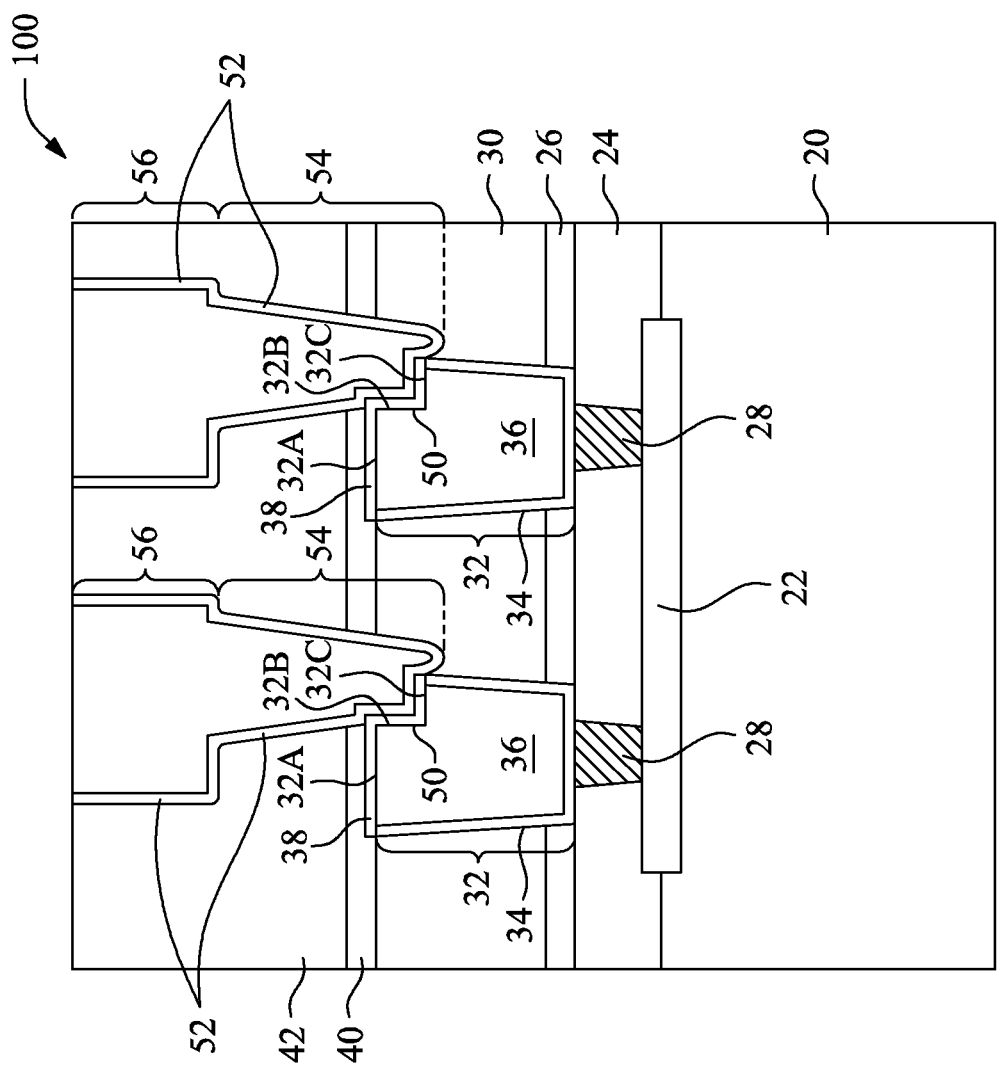

FIG. 7 illustrates the formation of conductive vias 54 in via openings 44 (FIG. 6), and conductive lines 56 in trenches 46. Vias 54 and conductive lines 56 may include liners 52, such as diffusion barrier layers, adhesion layers, or the like. Liners 52 may include titanium, titanium nitride, tantalum, tantalum nitride, or other alternatives. The inner material of conductive lines 56 over liners 52 is a conductive material such as copper, a copper alloy, silver, gold, tungsten, aluminum, or the like. In some embodiments, the formation of vias 54 and conductive lines 56 includes performing a blanket deposition to form liner 52, depositing a thin seed layer of copper or copper alloy, and filling the rest of via openings 44 and trenches 46 by, for example, electroplating, electro-less plating, deposition, or the like. A CMP may be performed to level the top surface of conductive lines 56 and/or liners 52 and to remove excess material from the top surface of IMD layer 42.

In the structure shown in FIG. 7, vias 54 extend into IMD layer 30. Furthermore, vias 54 are in contact with sidewalls 32B and top surfaces 32C of metal lines 32C. Hence, the contact area between vias 54 and the corresponding metal lines 32C include both sidewalls 32B and top surfaces 32C. Accordingly, the additional contact area of sidewalls 32B advantageously reduces the contact resistance between vias 54 and the underlying metal lines 32. It is appreciated that surfaces 32B and 32C of metal lines 32 are used for conducting currents flowing between vias 54 and the corresponding metal lines 32, while surfaces 32A of metal lines 32 are not used for conducting the currents flowing between vias 54 and the corresponding metal lines 32.

Figure 8:
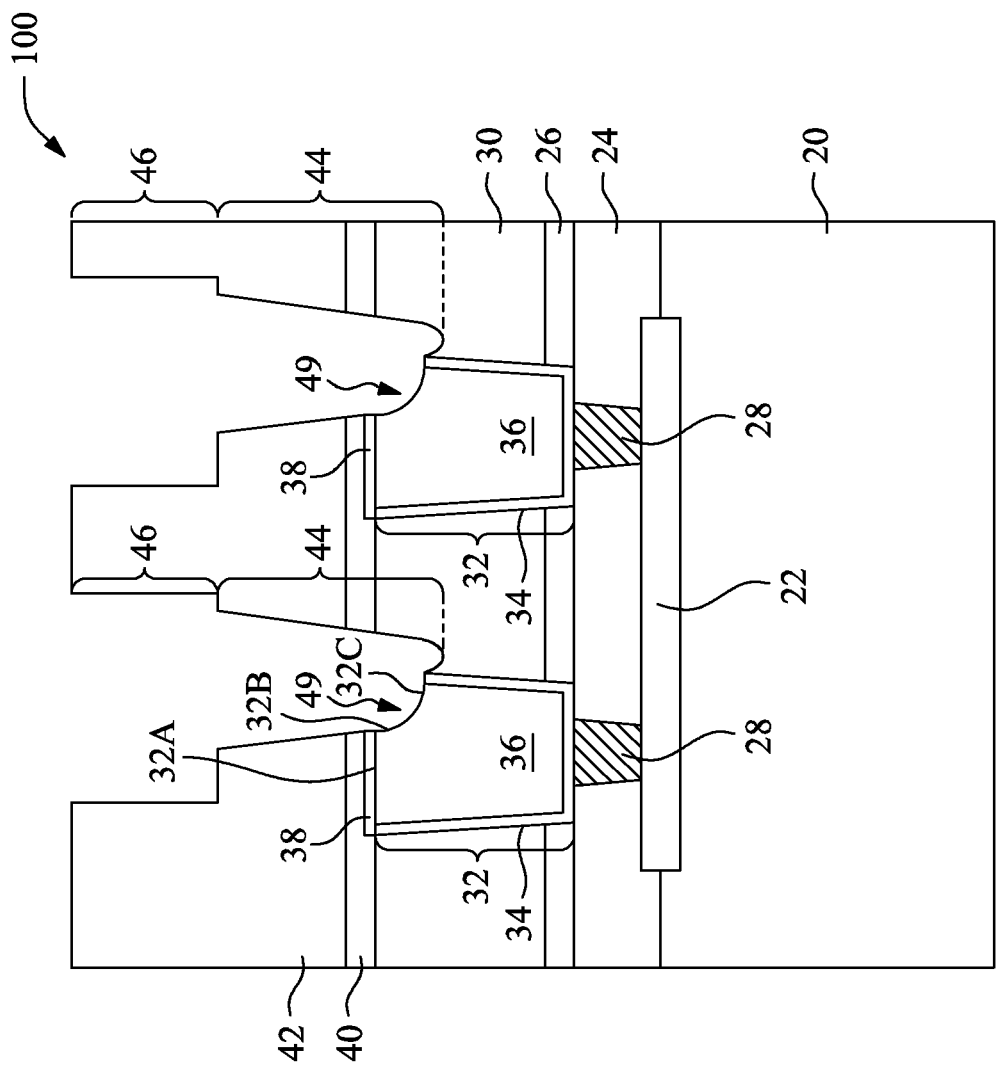
FIGS. 8-15 illustrate the cross-sectional views of intermediate stages in the formation of interconnect structures in accordance with alternative embodiments.
Figure 9:
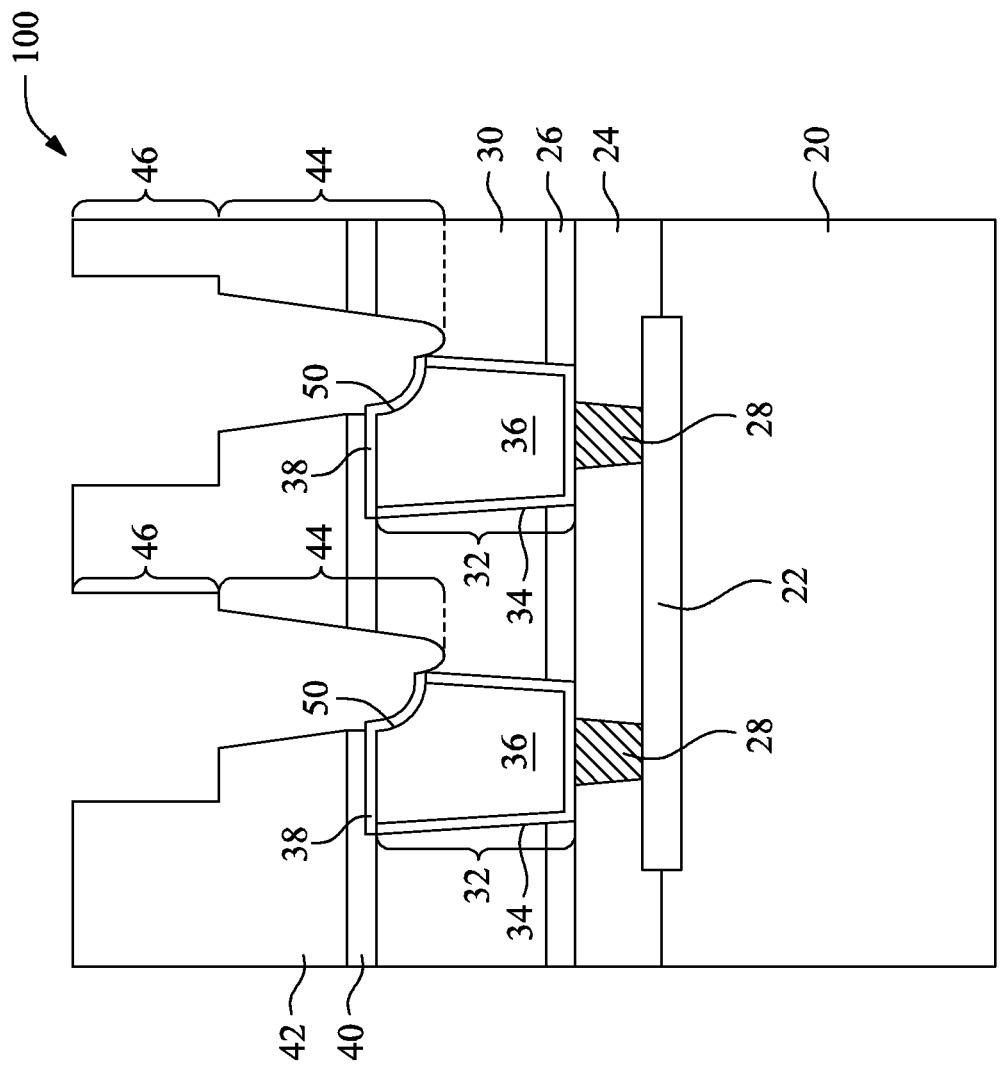
Figure 10:
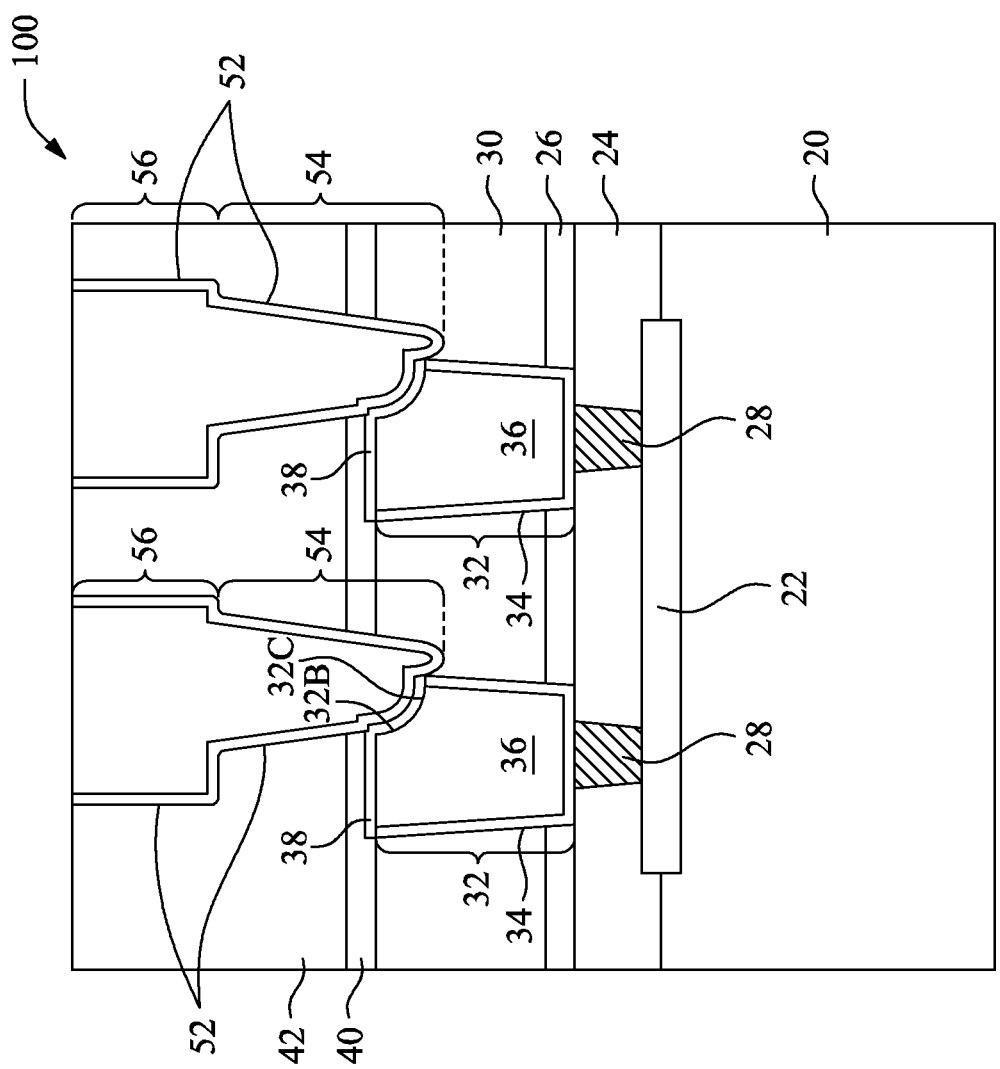

FIGS. 8 through 10 illustrate cross-sectional views of intermediate stages in the formation of an interconnect structure in accordance with alternative embodiments. Unless specified otherwise, the materials and the formation methods of the components in these embodiments are essentially the same as their like components, which are denoted by like reference numerals in the embodiments shown in FIGS. 1 through 7. The details regarding the formation process and the materials of the components shown in FIGS. 8 through 10 (and the embodiments in FIGS. 11 through 15) may thus be found in the discussion of the embodiment shown in FIGS. 1 through 7.

The initial steps of these embodiments are essentially the same as shown in FIGS. 1 through 4. Next, the oxide regions 48 are removed, hence forming recesses 49 in metal lines 32. The resulting structure is shown in FIG. 8. The profile in FIG. 8 may be generated by adjusting the process conditions to be different from the process conditions used in the step shown in FIG. 5 and/or adjusting the process conditions for forming oxide regions 48 (FIG. 4). In these embodiments, the remaining metal lines 32 have curved sidewalls 32B and top surfaces 32C. Alternatively stated, sidewalls 32B and top surfaces 32C are curved and may be continuously and smoothly connected. This may be achieved, for example, through a process that is more isotropic than the process used in the step of FIG. 5. The resulting top surfaces 32A and 32C and sidewalls 32B also form steps, except the profile of the steps is curved.

FIG. 9 illustrates the formation of metal caps 50, which may be formed using a material selected from the same group of candidate materials for forming the metal caps 50 in FIG. 6. Similarly, metal caps 38 and 50 may have the same composition or different compositions. Metal caps 38 and 50 also form steps.

FIG. 10 illustrates the formation of vias 54 and conductive lines 56. The formation process is similar to the process shown in FIG. 7 and hence is not repeated herein. In the resulting structure, vias 54 include curved lower portions contacting the sidewalls 32B and top surfaces 32C of metal lines 32.

Figure 11:
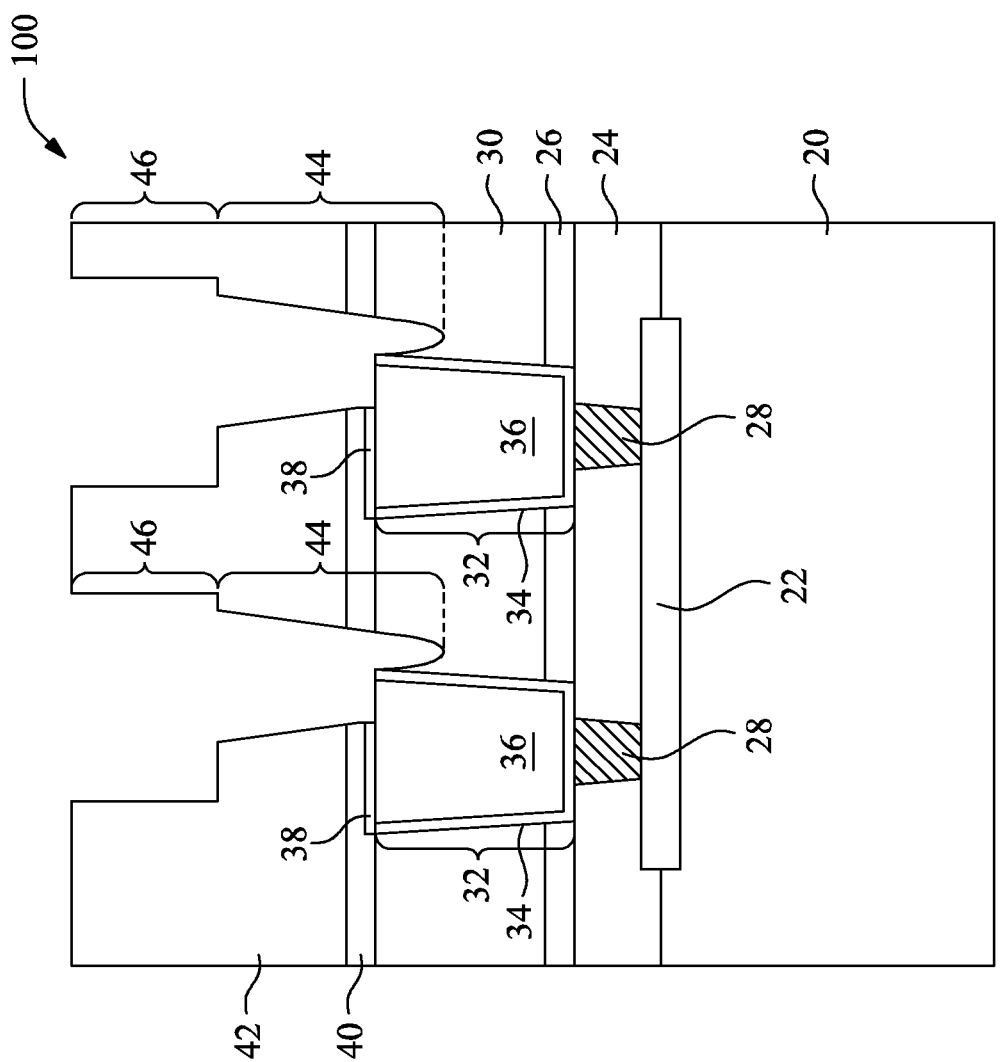
Figure 12:
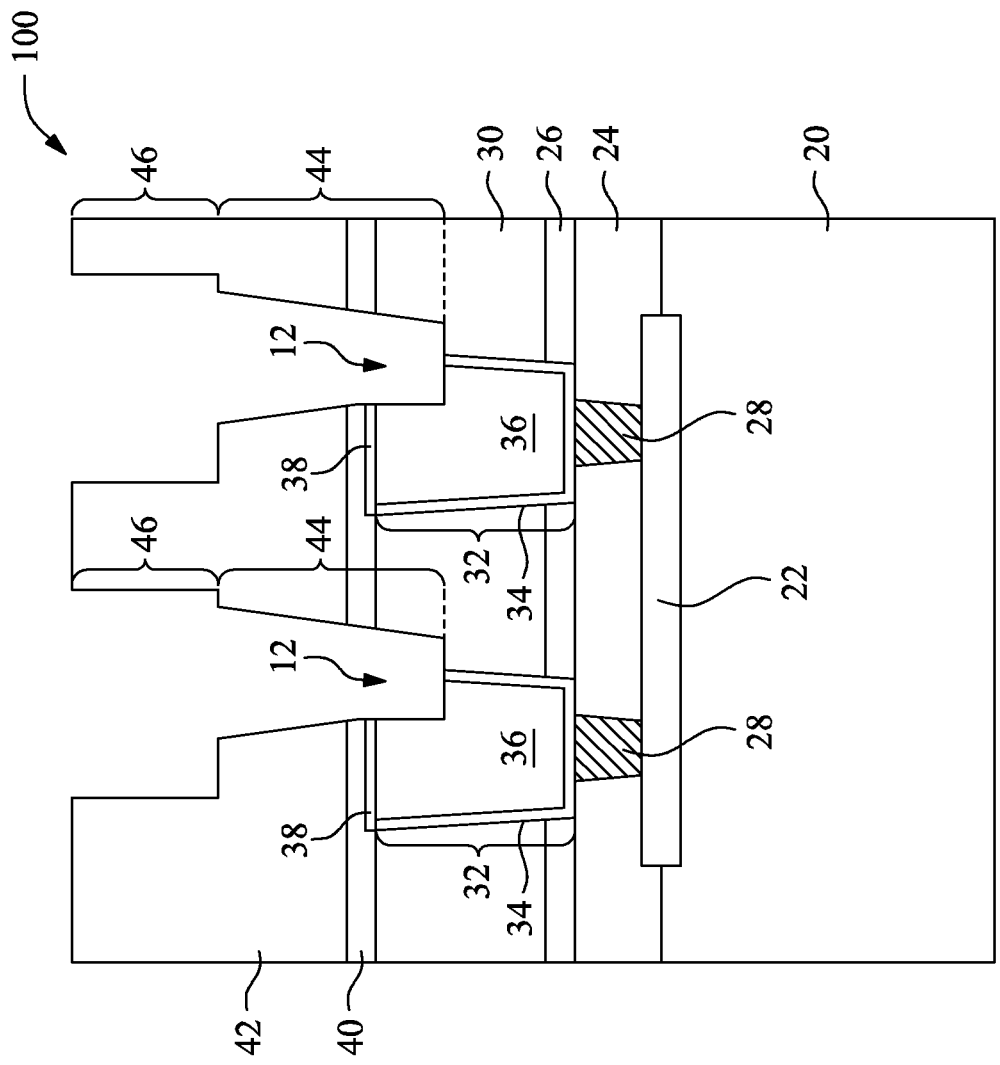
Figure 13:
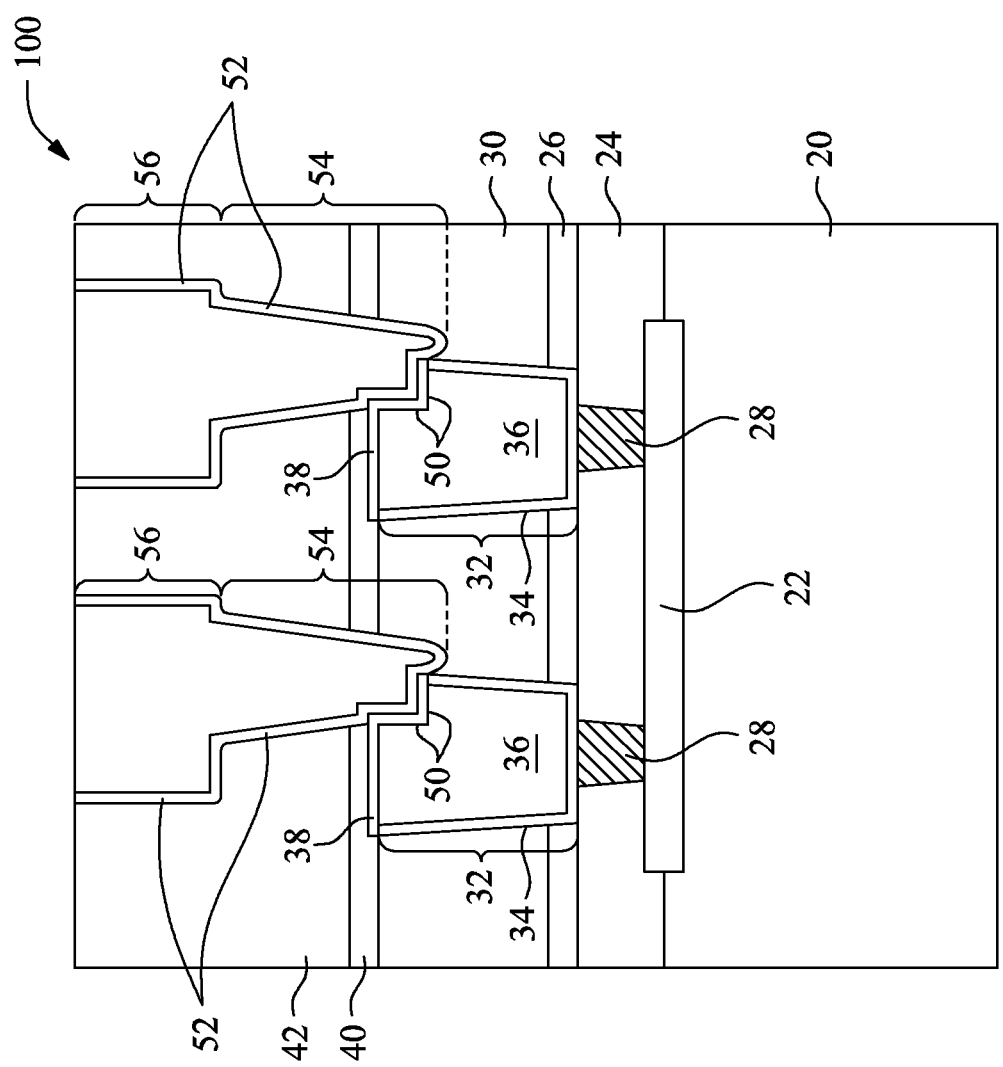

FIGS. 11 through 13 illustrate the formation of an interconnect structure in accordance with yet alternative embodiments. The initial steps of these embodiments are the same as shown in FIGS. 1 through 3, and FIG. 11 illustrates a structure that is essentially the same as FIG. 3. Next, recesses 49 are formed at the corner regions of metal lines 32, as shown in FIG. 12. In these embodiments, rather than oxidizing metal lines 32 and then removing the resulting oxide regions, metal lines 32 are etched directly using IMD 42 as a mask. In some exemplary embodiments, the process gases for etching metal lines 32 include a fluorine and carbon containing gas such as $CF_4$ and possibly a carrier gas such as $N_2$. In some exemplary etching processes, the flow rate of $CF_4$ is in the range of about 10 sccm to about 100 sccm, and the flow rate of $N_2$ is in the range of about 0 sccm to about 50 sccm. During the etching process, wafer 100 may be maintained at a temperature between about 30° C. and 120° C. The Radio Frequency (RF) power of the power source for the etching is lower than about 2,000 Watts, and the pressure of the process gases is lower than about 10 mtorr. The resulting structure may be shown in FIG. 12, which is similar to the structure shown in FIG. 5.

FIG. 13 illustrates the formation of metal caps 50, metal vias 54, and metal lines 56. The formation processes are essentially the same as discussed referring to FIGS. 6 and 7 and hence are not repeated herein. The resulting structure is also similar to what is shown in FIG. 7.

Figure 14:
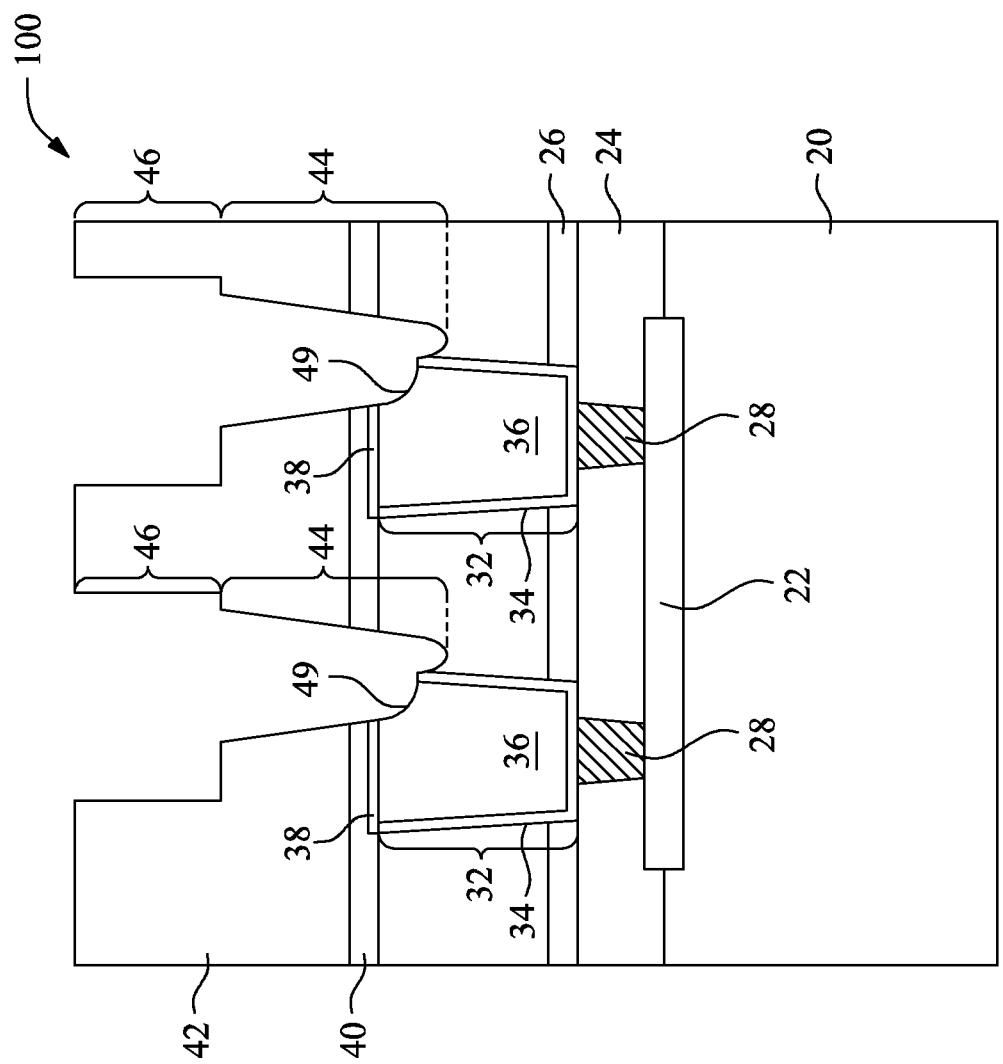
Figure 15:
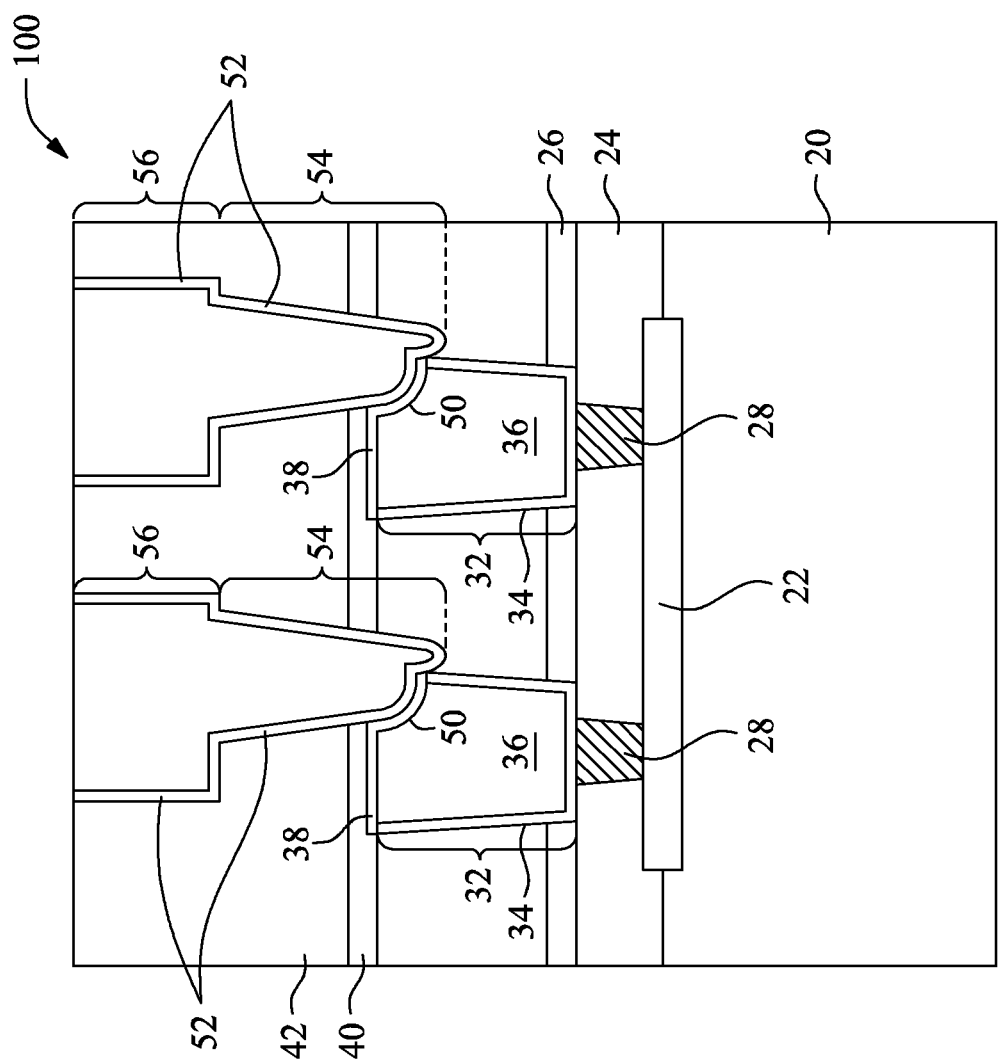

FIGS. 14 and 15 illustrate the formation of an interconnect structure in accordance with yet another alternative embodiments. The initial steps are essentially the same as shown in FIGS. 1 through 3. Next, by directly etching the corner regions of metal lines 32 (without going through oxidation process), the structure shown in FIG. 14 is generated. The profile in FIG. 14 may be generated by adjusting the process conditions so that a rounded profile is generated. FIG. 15 illustrates the formation of metal caps 50, vias 54, and metal lines 56. The formation processes are essentially the same as discussed referring to FIGS. 6 and 7 and hence are not repeated herein. The resulting structure is also similar to what is shown in 10.

Figure 16:
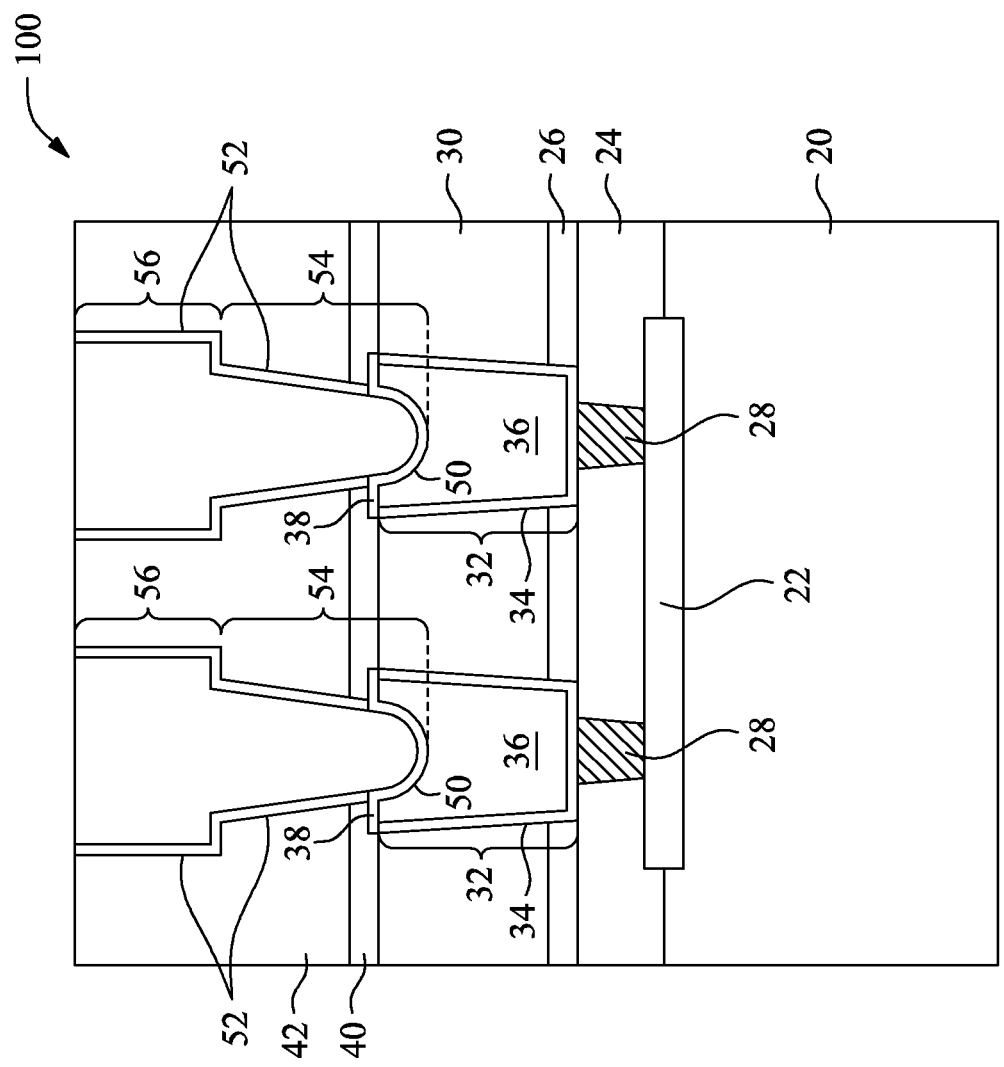
FIG. 16 illustrates the cross-sectional view of an interconnect structure when no misalignment occurs.

FIG. 16 illustrates the cross-sectional view of an interconnect structure when no misalignment occurs. In this situation, the recess in metal lines 36 will be in the middle of metal lines 36, and metal caps 50 will extend into metal lines 36. The process detail and the material for forming the structure in FIG. 16 is essentially the same as shown in FIGS. 1 through 15, except that no misalignment occurs.

Figure 17:
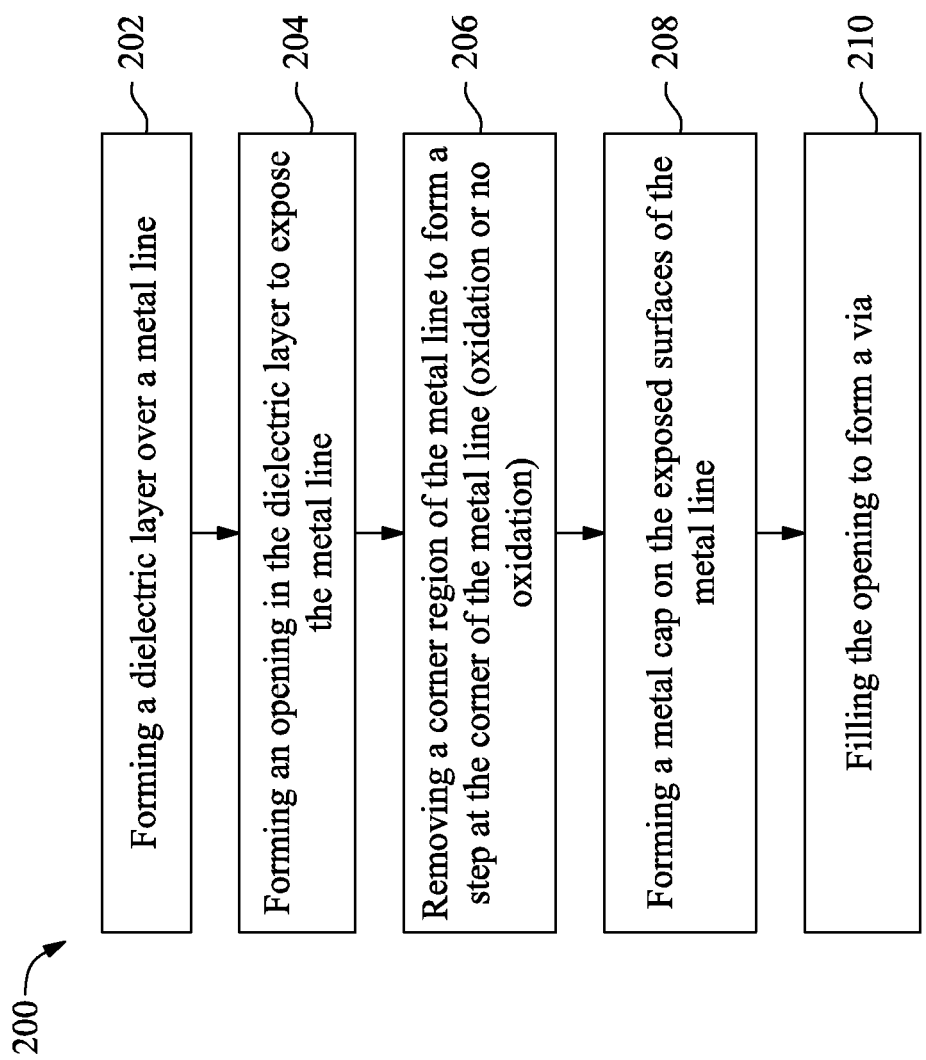
FIG. 17 illustrates a process flow for forming an interconnect structure.

FIG. 17 schematically illustrates the process flow 200 for the processes in FIGS. 1 through 15. The process flow is briefly discussed herein. The details of the process flow may be found in the discussion of FIGS. 1 through 15. In step 202, dielectric layer (IMD layer) 42 is formed over metal lines 32, as shown in FIGS. 1 and 2. In step 204 of the process flow in FIG. 17, via opening 44 is formed in dielectric layer 42, and the respective formation process is illustrated in FIG. 3. In step 206 of the process flow in FIG. 17, the corner regions of metal lines 32 are removed, and the respective formation process is illustrated in FIGS. 4 and 5. In step 208 of the process flow in FIG. 17, metal cap 50 is formed on the exposed surface of metal line 32, and the respective formation process is illustrated in FIG. 6. In alternative embodiments, metal cap 50 is not formed. In step 210 of the process flow in FIG. 17, via opening 44 is filled to form via 54 (and metal lines 56 is also formed), and the respective formation process is illustrated in FIG. 7.

The embodiments of the present disclosure have some advantageous features. By etching metal lines (either through oxidation or not through oxidation), the sidewalls of the metal lines are exposed and are used to contact the subsequently formed metal vias. The contact areas are thus increased, and the contact resistance is reduced. Experiment results revealed that by increasing depth D1 (FIG. 5) of the recesses in metal lines to 7 nm in some exemplary interconnect structure, the contact resistance is reduced by 60 percent. Furthermore, experiments also revealed that the additional etching process used in the embodiments of the present disclosure does not result in the undesirable degradation in the reliability of the interconnect structure.

In accordance with some embodiments of the present disclosure, an integrated circuit structure includes a dielectric layer and a conductive line in the dielectric layer. The conductive line has a first top surface and a second top surface lower than the first top surface as well as a sidewall connecting the first top surface to the second top surface. A via includes a portion overlying the second top surface of the conductive line. The via is electrically coupled to the conductive line through the second top surface and the sidewall of the conductive line.

In accordance with alternative embodiments of the present disclosure, a structure includes a dielectric layer and a conductive line in the dielectric layer. The conductive line has a first top surface and a second top surface lower than the first top surface as well as a sidewall connecting the first top surface to the second top surface. A first metal cap is over and contacts the first top surface of the conductive line. A second metal cap contacts the second top surface and the sidewall of the conductive line. A via has a portion overlying the second top surface of the conductive line, wherein the via is in contact with the second metal cap.

In accordance with yet alternative embodiments of the present disclosure, a method includes forming a dielectric layer over a conductive line and etching the dielectric layer to form an opening, with at least a portion of the via opening substantially aligned to the conductive line. A corner portion of the conductive line is then removed. The opening is filled with a conductive material to form a via electrically coupled to the conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A method comprising:
   forming a conductive line in a first dielectric layer;
   forming a second dielectric layer over the conductive line and the first dielectric layer;
   performing a first etching step to etch the second dielectric layer to form an opening extending into the second dielectric layer and further into the first dielectric layer, with at least a portion of the opening substantially aligned to the conductive line, wherein the opening generated by the first etching step has a bottom lower than a top surface of the conductive line;
   performing a second etching step to remove a corner portion of the conductive line; and
   filling the opening with a conductive material to form a via electrically coupled to the conductive line.

2. The method of claim 1 further comprising forming a metal cap over an exposed surface of the conductive line, wherein a top surface of a portion of the metal cap is exposed by the first etching step, and the portion of the metal cap is removed in the second etching step, wherein the via is over and contacts the metal cap.

3. The method of claim 1, wherein the removing the corner portion of the conductive line comprises:
   oxidizing the corner portion of the conductive line to form an oxide region; and
   etching the oxide region.

4. The method of claim 1, wherein the first etching step comprises a dry etching process, and the second etching step comprises a wet etching process.

5. The method of claim 1, wherein the removing the corner portion of the conductive line comprises a wet etching process.

6. The method of claim 1, wherein in the first etching step, the corner portion of the conductive line is not etched, and a top tip of the corner portion is exposed to the opening.

7. A method comprising:
   forming a conductive line in a first dielectric layer, with a first top surface of the conductive line substantially coplanar with a second top surface of the first dielectric layer;
   forming a second dielectric layer over the conductive line and the first dielectric layer;
   performing a first etching step to etch the second dielectric layer and the first dielectric layer to form an opening extending into the first dielectric layer;
   performing a second etching step to remove a corner portion of the conductive line, wherein the opening is expanded by the second etching step; and
   selectively forming a conductive cap on exposed portions of the conductive line, wherein a first portion of a lower portion of the opening lower than a top surface of the conductive line is filled by the conductive cap, and a second portion of the lower portion of the opening remains unfilled by the conductive cap; and
   filling the opening with a conductive material to form a via electrically coupled to the conductive line.

8. The method of claim 7 further comprising:
   performing an oxidation on the corner portion of the conductive line to form an oxide region, wherein the second etching step comprises removing the oxide region; and
   forming a dielectric etch stop layer over the conductive line, wherein the oxidation is performed through an additional opening in the dielectric etch stop layer.

9. The method of claim 8, wherein the oxide region has an edge substantially vertically aligned to a respective edge of the additional opening in the dielectric etch stop layer.

10. The method of claim 7, wherein the via extends beyond a sidewall of the conductive line.

11. The method of claim 7, wherein the via is between two remaining portions of the conductive line, with top surfaces of the two remaining portions of the conductive line being portions of the first top surface.

12. The method of claim 7, wherein the first etching step comprises a dry etching, and the second etching step comprises a wet etching process.

13. The method of claim 7, wherein the opening generated by the first etching step has a bottom lower than a top surface of the conductive line.

14. The method of claim 7, wherein the second etching step further etches a portion of the second dielectric layer in contact with a sidewall of the conductive line.

15. A method comprising:
   forming a first conductive line in a first dielectric layer;
   forming a first metal cap over and contacting the first conductive line;
   forming an etch stop layer over the first metal cap and the first dielectric layer;
   forming a second dielectric layer over the etch stop layer;
   performing a first etching step to etch the second dielectric layer, the etch stop layer, and the first dielectric layer to form a trench and a via opening underlying the trench, wherein a portion of the first metal cap is exposed to the via opening and the trench, and a portion of the first dielectric layer remains between a bottom portion of the via opening and a sidewalls of the first conductive line;
   performing a second etching step to remove a portion of the first metal cap, a portion of the first conductive line, and the portion of the first dielectric layer to form a recess in the first metal cap and the first conductive line, with the recess joined to the via opening and the trench; and
   filling the trench and the via opening with a conductive material to form a second conductive line and a via, respectively.

16. The method of claim 15, wherein the second etching step comprises:
   oxidizing the portion of the first metal cap and the portion of the first conductive line to form an oxide region; and
   selectively etching the oxide region.

17. The method of claim 15, wherein the removing the portion of the first metal cap and the portion of the first conductive line comprises etching the portion of the first metal cap and the portion of the first conductive line through the trench and the via opening.

18. The method of claim 15 further comprising selectively plating a second metal cap in the recess.

19. The method of claim 15, wherein the portion of the first metal cap comprises a corner portion of the first metal cap, and the via opening has a portion misaligned from the first conductive line.

20. The method of claim 15, wherein the portion of the first metal cap removed in the second etching step is a middle portion of the first metal cap, and the method further comprises forming a second metal cap in the recess.

* * * * *